United States Patent
Wu

(10) Patent No.: US 6,355,540 B2
(45) Date of Patent: *Mar. 12, 2002

(54) STRESS-FREE SHALLOW TRENCH ISOLATION

(75) Inventor: Shye-Lin Wu, Hsinchu (TW)

(73) Assignee: Acer Semicondutor Manufacturing Inc. (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/123,746

(22) Filed: Jul. 27, 1998

(51) Int. Cl.[7] ............................................... H01L 21/76
(52) U.S. Cl. ..................... 438/433; 438/424; 438/435; 257/510
(58) Field of Search ................. 257/510, 506, 257/647, 397, 399, 400, 519, 648; 438/424, 433, 435

(56) References Cited

U.S. PATENT DOCUMENTS

| | | | | |
|---|---|---|---|---|
| 4,931,409 A | * | 6/1990 | Nakajima et al. | 438/431 |
| 5,433,794 A | * | 7/1995 | Fazan et al. | 257/506 |
| 5,436,488 A | * | 7/1995 | Poon et al. | 257/397 |
| 5,472,904 A | * | 12/1995 | Figura et al. | 438/426 |
| 5,643,822 A | * | 7/1997 | Furukawa et al. | 438/421 |
| 5,668,044 A | * | 9/1997 | Ohno | 438/433 |
| 5,674,775 A | * | 10/1997 | Ho et al. | 438/424 |
| 5,679,602 A | * | 10/1997 | Lin et al. | 438/221 |
| 5,753,561 A | * | 5/1998 | Lee et al. | 438/424 |
| 5,780,346 A | * | 7/1998 | Arghavani et al. | 438/296 |
| 5,783,476 A | * | 7/1998 | Arnold | 438/425 |
| 5,786,262 A | * | 7/1998 | Jang et al. | 438/424 |
| 5,801,083 A | * | 9/1998 | Yu et al. | 438/424 |
| 5,897,360 A | * | 4/1999 | Kawaguchi | 438/431 |
| 5,933,748 A | * | 8/1999 | Chou et al. | 438/431 |
| 5,960,298 A | * | 9/1999 | Kim | 438/424 |
| 6,069,057 A | * | 5/2000 | Wu | 438/424 |
| 6,097,076 A | * | 8/2000 | Gonzalez et al. | |

FOREIGN PATENT DOCUMENTS

| | | | | |
|---|---|---|---|---|
| DE | 3809653 A1 | * | 10/1988 | H01L/27/10 |
| JP | 3-142933 | * | 6/1991 | |
| JP | 05043736 | * | 12/1993 | H01L/21/76 |
| JP | 06233937 | * | 4/1996 | H01L/21/76 |
| JP | 090445760 | * | 2/1997 | H01L/21/76 |

OTHER PUBLICATIONS

S. Wolf, Silicon Processing for the VLSI Era vol. 2: Process Integration, 1990 Lattice Press, p. 22.*

* cited by examiner

*Primary Examiner*—Charles Bowers
*Assistant Examiner*—David S Blum
(74) *Attorney, Agent, or Firm*—Powell, Goldstein, Frazer & Murphy LLP

(57) ABSTRACT

The present invention proposes a shallow trench isolation region in a semiconductor substrate for ULSI devices. The trench region includes a thermal oxide film formed on the bottom and the sidewall, a CVD dielectric film formed on the bottom of the thermal oxide film, and a channel stop region formed beneath the bottom of the thermal oxide film. The processes described as follows. Forming a pad oxide/silicon nitride layer on the substrate, the trench region and active area are defined. After silicon spacers are formed, the silicon substrate is recessed to form trench region by using the silicon nitride layer and silicon spacers as etching mask. A channel stopping implantation is performed. Then a thermal oxide film is regrown on the trench surface. After removing the silicon nitride layer, a thick CVD dielectric layer is deposited on the substrate. The dielectric film outside the trench region is removed by a CMP process, and thus the present invention complete.

12 Claims, 4 Drawing Sheets

STRESS-FREE SHALLOW TRENCH ISOLATION

BACKGROUND OF THE INVENTION

1. Field of the Invention

The present invention relates to a semiconductor device, and more especially, to a method for fabricating shallow trench isolation.

2. Description of the Prior Art

For building an integrated circuit operating with desired action, it is necessary to fabricate many active devices on a single semiconductor substrate. Various kinds of devices with different functions, such as transistors, resistors and capacitors, are formed together. Each of the devices on the substrate must be electrically isolated from the others to ensure their individual function. The art of isolating semiconductor devices becomes one important aspect of modern metal-oxide-semiconductor (MOS) and bipolar integrated circuit technology for the separation of different devices or different functional regions. With the high integration of the semiconductor devices, improper isolation among devices will cause current leakage, and the current leakage can consume a significant amount of power. Improper isolation will result in circuit latch-up, which can destroy the circuit temporarily or even permanently. In addition, improper isolation can cause degradation in circuit noise margin, voltage shift and crosstalk.

Local oxidation of silicon (LOCOS) is one of the most well known techniques for isolation. LOCOS provides the isolation by oxidizing the silicon substrate to create silicon dioxide regions among active devices or functional regions. Because it is easy for the silicon substrate to be oxidized into silicon dioxide, LOCOS has the benefits of its process simplicity and low cost, and it becomes the most widely used isolation technique in very large scale integrated (VLSI) circuit. However, with the tendency for the manufacture of semiconductor integral circuit to high package density, LOCOS meets the limitation in its scalability.

The trench isolation, which is usually referred as shallow trench isolation (STI), is another isolation technique developed especially for semiconductor chip with high integration. The trench regions are formed in the semiconductor substrate by recessing the substrate deep enough for isolation and refilling with insulating material to provide the isolation among active devices or different well regions. In general, trench isolation has a better scalability in comparison with LOCOS isolation.

In the paper "Characteristics of CMOS Device Isolation for the ULSI Age" in IEDM Tech. Dig., p. 671, 1994, by A. Bryant, et al., the two different isolation techniques of LOCOS and STI are investigated. The paper reviews how LOCOS and STI isolations are being improved to meet the scaling requirements for abrupt active-isolation transitions, isolation depth, and isolation planarity. For deep sub-micron CMOS generation, the conventional LOCOS isolation suffers from several drawbacks such as large lateral extend of bird's beak, non-planarity, local field oxide thinning effect, and stress-induced silicon defects. The key challenges to LOCOS scaling are insulator thinning at narrow dimension, bird's beak formation, and field-implant encroachment. For future CMOS technology, an effective device isolation method that provides abrupt transitions to active device regions with minimum impact on device characteristics or topography will be required. They come to the conclusions that, at the cost of a trench-fill and planarization, STI is a more direct method of meeting these requirements while benefiting from a significant advantage in planarity.

Trench isolation is developed to be a better isolation technique in deep sub-micron CMOS generation due to the advantages in its scalability, planarity, and isolation depth. But it still encounters several problems such as silicon damage induced by etching and the corner effects. In the paper entitled "Correlation between Gate Oxide Reliability and the Profile of the Trench Top Corner in Shallow Trench Isolation (STI)", IEDM Tech. Dig., p.747, 1996, T. Park, et al., illustrated three schematic profiles of oxide etch-back trench corners. The gate conductor could wrap around the trench corner when a conventional oxide etch-back process is performed. They propose for above situation a two-step trench etching with a sidewall around. With this two-step trench etching process, the corner parasitic leakage and the gate wrap-around could be solved.

In 1997, T. Park, et al., proposed another method named "very simple trench isolation technology" in their paper "A Very Simple Trench Isolation (VSTI) Technology with Chemo-Mechanically Polished (CMP) Substrate Si" Symposium On VLSI Tech. Dig., p. 121. Based on the idea that the Si wafer is finalized with CMP step, this method provides a simple process to fabricate the isolated trench regions with smaller number of steps compared to the conventional trench isolation technique or even the LOCOS isolation. By this method, low junction leakage current, high breakdown voltage and flat surface can be reached, but the double hump associated with sharp top corner of the active to field boundary could not be completely avoided at a large reverse biased condition.

SUMMARY OF THE INVENTION

A method for fabricating shallow trench regions in a semiconductor substrate is disclosed. Silicon sidewall spacers and a thick thermal oxide film are created at and near the trench corners to prevent the corner effect such as the gate wrap-around and corner parasitic leakage. According to the processes, the trench region is formed with a thermal oxide film on the bottom and the sidewall, a CVD dielectric film on the bottom of the thermal oxide film, and a channel stop region beneath the bottom of the thermal oxide film.

Forming a pad oxide and a silicon nitride layer on a semiconductor substrate, the trench region and active area are defined by a photoresist photolithography followed by an anisotropic nitride etching. After silicon spacers are formed, the semiconductor substrate is recessed to form trench region by another dry etching using the silicon nitride layer and silicon spacers as etching hard mask. A channel stopping implantation is performed. Then a thermal oxide film is regrown on the trench surface to recover the etching damages. After removing the silicon nitride layer, a thick CVD oxide layer, which is formed of TEOS-oxide or BPSG, etc., is deposited on the semiconductor substrate. The oxide film outside the trench regions is removed by using a CMP process. A sacrificial oxide is grown and removed for recovering the polish damages. Finally, the MOS devices are fabricated on the semiconductor substrate by standard processes, and thus complete the present invention.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention proposes a simple method to fabricate shallow trenches for isolation. The method described here includes many process steps well known in the art like photolithography, etching or chemical vapor deposition (CVD) which are not discussed in detail. In addition, the present invention utilizes silicon sidewall spacers and a thick thermal oxide film to prevent etching damages and the sharp trench corner effects.

Figure 1:
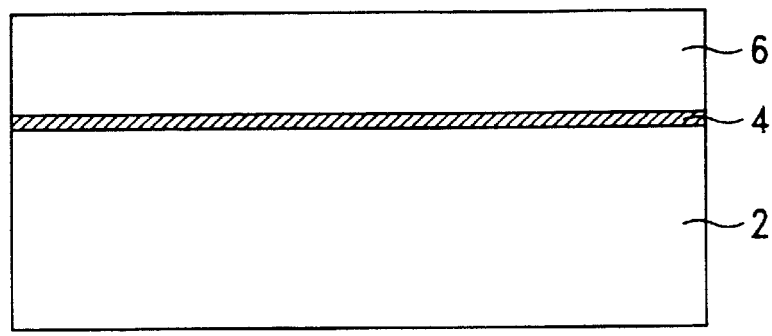
FIG. 1 is a cross-sectional view of a semiconductor wafer illustrating the step of forming a pad oxide and a nitride layer on the substrate according to the present invention.

Referring to FIG. 1, a single crystal silicon substrate 2 with a <100> crystallographic orientation is provided. A silicon oxide layer 4 with the thickness about 50–500 angstroms is formed on the surface of the substrate 2 to serve as a pad oxide. This pad oxide layer 4 can be grown by using low pressure chemical vapor deposition (LPCVD) at a temperature of about 400–750° C., or using thermal oxidation at a temperature of about 800–1100° C. A silicon nitride layer 6 is then deposited, for example, using a LPCVD process at a temperature of about 700–800° C. , on the silicon oxide layer 4. The thickness of the silicon nitride layer 6 is about 500–4000 angstroms. The pad oxide layer 4 acts here as a buffer to cushion the transmission of stress between the silicon substrate and the silicon nitride layer 6.

Figure 2:
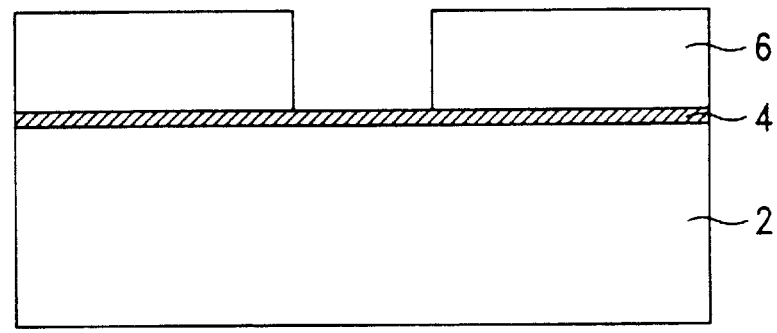
FIG. 2 is a cross-sectional view of a semiconductor wafer illustrating the step of defining the trench regions on the substrate according to the present invention.

Turning next to FIG. 2, the trench pattern is now defined on the silicon nitride layer 6 by using a conventional manner of photoresist photolithography including photoresist coating, exposure, and development processes. A dry etching process then follows to etch the thick silicon nitride layer 6 and expose the trench region of the pad oxide layer 4. A reactive ion etching (RIE) with plasma gases containing fluoride such as $CF_4/O_2$, $CF_2/H_2$, $CHF_3$ or $NF_3$ is preferable for this anisotropic etching.

Figure 3:
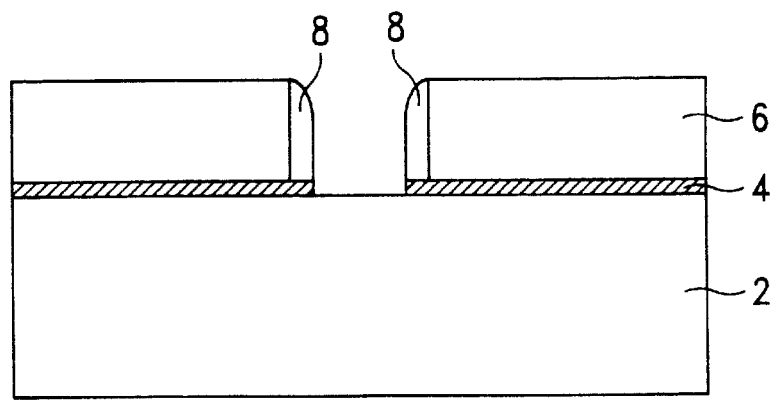
FIG. 3 is a cross-sectional view of a semiconductor wafer illustrating the step of forming silicon spacers on the sidewalls of the nitride layer according to the present invention.

Next, after the photoresist is removed and wet cleaned, a pair of silicon spacers 8 with a thickness of about 200 to 1000 angstroms are formed on the sidewalls of the silicon nitride layer 6 as shown in FIG. 3. These silicon spacers 8 are formed of amorphous silicon or polysilicon by a blanket deposition for silicon layer over the semiconductor substrate 2 followed by an etching back. The suitable deposition method can be LPCVD at a temperature of about 400–575° C. for amorphous silicon and 575–650° C. for polysilicon. The method for etching back should be a dry etching using $Cl_2$, $BCl_3$, HBr, $SF_6$ or $SiCl_4$ as the etching gases. The exposed portion of pad oxide layer 4 is then removed by a dry etching with plasma gases such as $CF_4$, $CHF_3$, $C_2F_6$ or $C_3F_8$. A wet etching using buffered oxide-etching (BOE) solution or diluted solution of hydrofluoric acid (HF) as the etchant can be a substitutional choice for this oxide etching.

Figure 4:
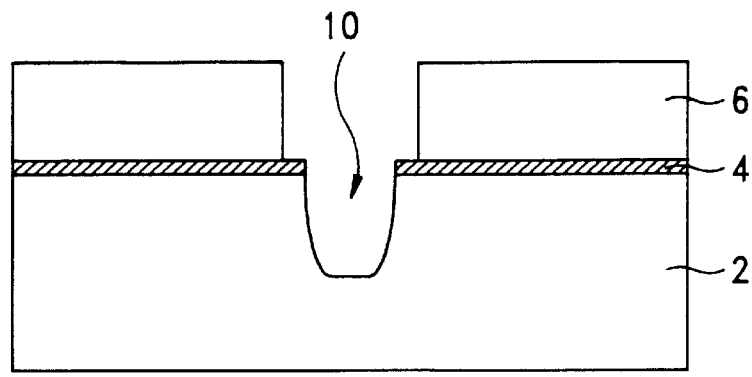
FIG. 4 is a cross-sectional view of a semiconductor wafer illustrating the step of recessing the silicon substrate to form shallow trenches in the substrate according to the present invention.

Thereafter, another dry etching using $Cl_2$, $BCl_3$, HBr, $SF_6$ or $SiCl_4$ as the plasma source is carried out. At this anisotropic etching step, the exposed portion of the semiconductor substrate 2 is recessed by using the patterned silicon nitride layer 6 and the silicon spacers 8 as the etching hard mask. The trench 10 with a depth deep enough for isolation is thus opened and shown in FIG. 4. During the recessing process of silicon substrate, the silicon spacers 8 are also removed.

Figure 5:
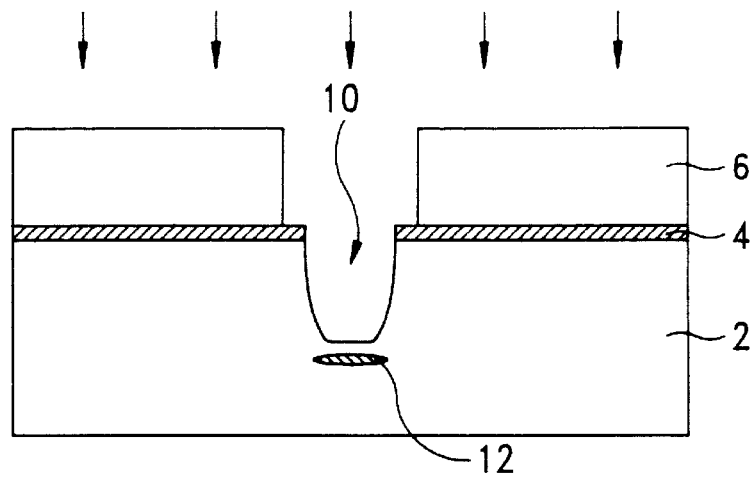
FIG. 5 is a cross-sectional view of a semiconductor wafer illustrating the step of performing a channel stopping implantation according to the present invention.
Figure 6:
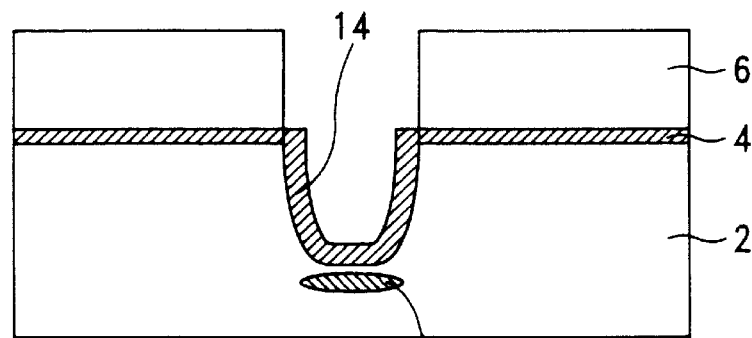
FIG. 6 is a cross-sectional view of a semiconductor wafer illustrating the step of performing a thermal oxidation to recover damages according to the present invention.

An ion implantation is then optionally carried out with the ions of opposite conductive type to that of the channel of the active devices, as shown in FIG. 5, wherein the arrows indicate the implanting direction. This opposite type ion implantation is performed for the channel stop 12 to achieve a better device isolation. Referring to FIG. 6, a thermal oxidation in an oxygen containing ambient at a temperature of about 800–1100° C. is now performed. With the oxidation mask 6 wider than the trench opening, a thick robust thermal oxide layer 14 is grown on the trench surface. The damages induced on the substrate surface by previous dry etching process are recovered through this thermal process, and the trench corners are rounded simultaneously. Alternatively, the thermal oxidation can be performed in $N_2O$ or NO ambient, and then the material of the layer 14 would be silicon oxynitride.

Figure 7:
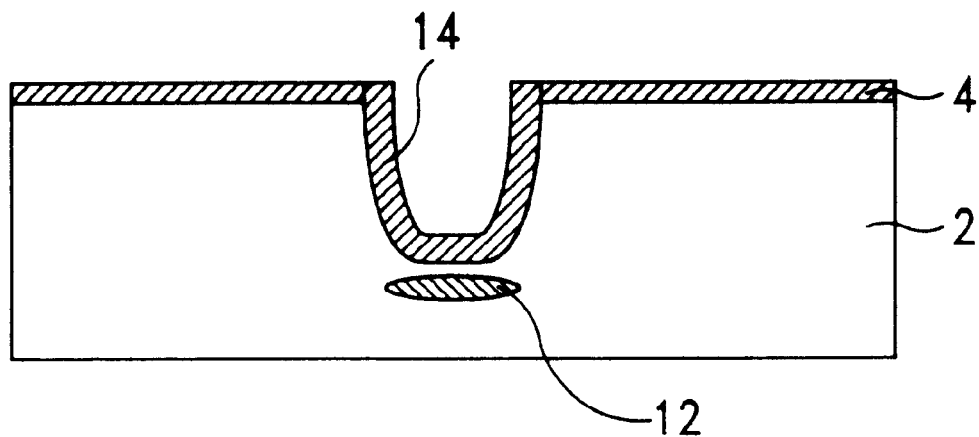
FIG. 7 is a cross-sectional view of a semiconductor wafer illustrating the step of removing the nitride layer according to the present invention.
Figure 8:
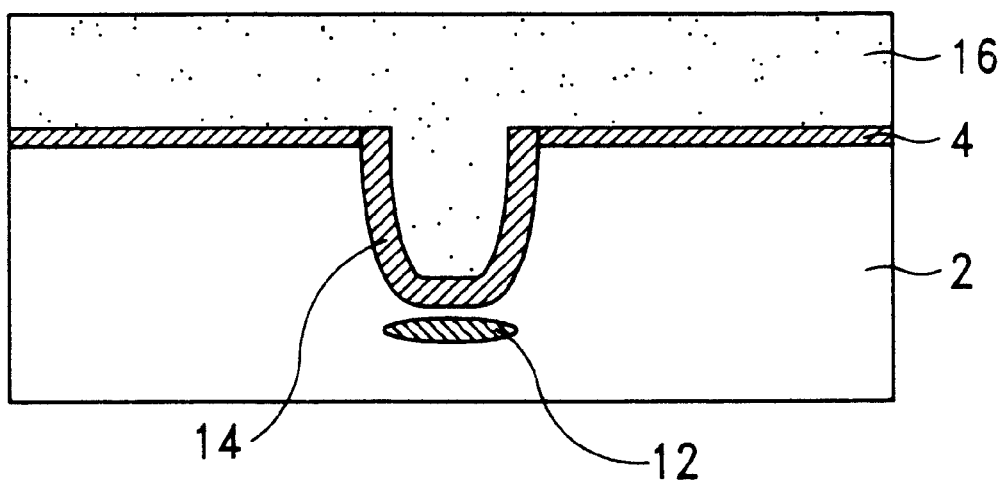
FIG. 8 is a cross-sectional view of a semiconductor wafer illustrating the step of depositing a CVD oxide on the substrate and refilling the trench regions according to the present invention.

Next, referring to FIG. 7, the masking silicon nitride layer 6 is removed by a wet etching using hot solution of phosphoric acid ($H_3PO_4$) as the etchant. A thick dielectric layer 16 is then deposited over the semiconductor substrate 2 and fills the trench region as shown in FIG. 8. The suitable method for forming this thick dielectric layer 16 can be LPCVD, PECVD (plasma-enhanced CVD) or HDPCVD (high-density plasma CVD) with the material of silicon nitride, silicon oxynitride, or silicon oxide, including tetra-ethyl-ortho-silicate-oxide (TEOS-oxide), ozone TEOS-oxide, boro-phospho silicate glass (BPSG), phospho silicate glass (PSG), boro silicate glass, (BSG), undoped silicate glass (USG) or silicon-rich oxide (SRO), and so on.

Figure 9:
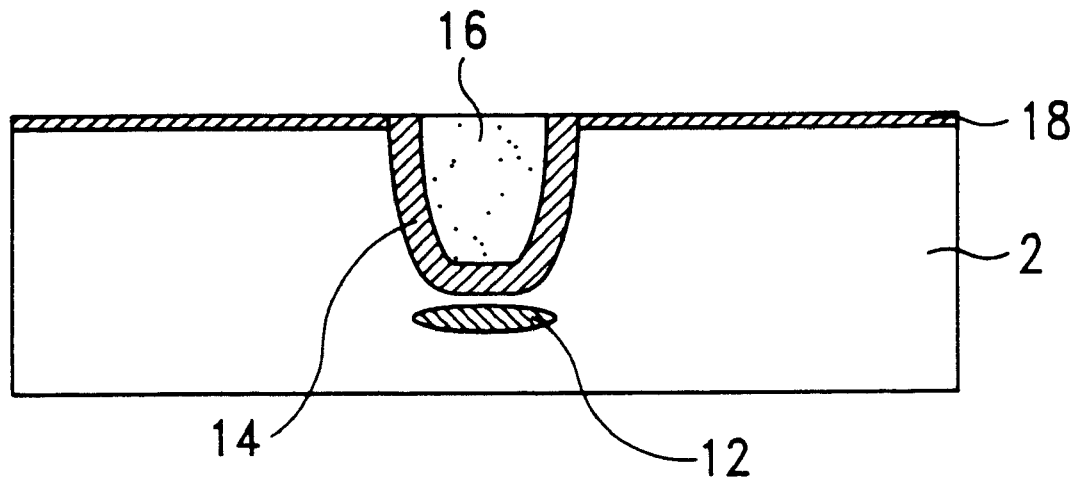
FIG. 9 is a cross-sectional view of a semiconductor wafer illustrating the step of etching back the CVD oxide and the thermal oxide outside the trench regions according to the present invention.

Now referring to FIG. 9, the pad oxide layer 4 and the portion of CVD oxide film 16 which exceeds the trench region in the semiconductor substrate 2, are stripped. The preferable method for this step can be chemical mechanical polishing (CMP) process for the global planarization that it can provide. Because the thermal oxide 14 is thickly grown over the trench surface, the same polishing rate is approximately kept at and near the trench corners, and the corner effects such as the gate wrap-around can be improved. The trenching isolation region is thus accomplished.

As to be the end point of the CMP process, the surface of the semiconductor substrate 2 will suffers from the polishing defects and contamination after this step. For recovering the polishing defects and eliminating the contamination, a thermal oxidation is performed, and a sacrificial oxide layer 18 is regrown on the semiconductor substrate 2.

Figure 10:
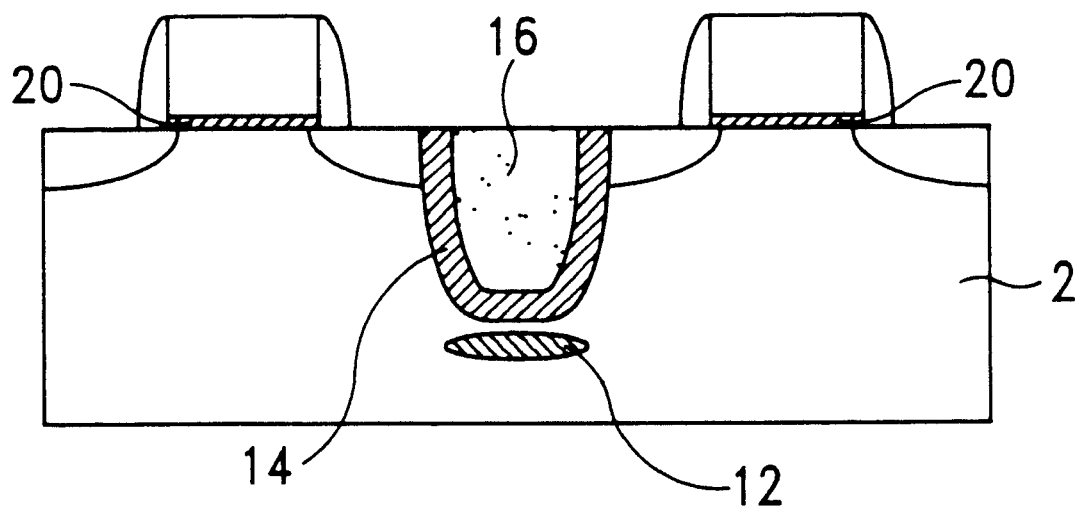
FIG. 10 is a cross-sectional view of a semiconductor wafer illustrating the step of fabricating MOSFET on the substrate according to the present invention.

Finally, referring to FIG. 10, the sacrificial oxide layer 18 is then etched back by a wet etching process. The preferable etchant for this wet etching is buffered oxide-etching (BOE) solution or diluted solution of hydrofluoric acid (HF). Thereafter the gate oxide layer 20 is regrown on the semiconductor substrate 2. Then the active devices that consist of gates, sources and drains are formed on the active regions to finish the fabrication of the MOS transistor.

According to above processes, the trench region with thermal oxide 14, CVD dielectric 16 and channel stop 12 is formed in a semiconductor substrate 2 to provide isolation among active devices. The thermal oxide layer 14 is formed on the bottom and the sidewall of the trench region; the CVD dielectric 16 is formed on the bottom of the thermal oxide 14, and the channel stop region 12 is formed beneath the bottom of the thermal oxide 14. By the use of the sidewall spacers, a thick thermal oxide is formed on the trench edges. The silicon damages induced by dry etching process would be reduced through long high temperature oxidation. The trench region have rounded top and bottom corners without suffering from corner effects such as the gate wrap-around. By solving these problems raised from conventional trench isolation technique, the integration of semiconductor fabrication can be greatly increased, and the method of the present invention can be applied in deep sub-micron or smaller CMOS devices.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for forming a dielectric liner on the sidewalls and bottom of a trench region formed in a semiconductor substrate, said method comprising the sequential steps of:

providing a first masking layer formed on said semiconductor substrate with a pattern exposing said trench region and a peripheral region;

forming an impurity-doped region in said semiconductor substrate only beneath said bottom of said trench region, wherein said impurity-doped region is located in a nonzero distance apart from said bottom of said trench region and within lateral lines which would extend from said bottom; and performing an oxidation using said first masking layer as oxidation mask to form said dielectric liner on said sidewalls, said bottom of said trench, and said peripheral region.

2. The method according to claim 1, wherein said first masking layer is formed of silicon nitride.

3. The method according to claim 1, wherein said first masking layer has a thickness of about 500 to 4000 angstroms.

4. The method according to claim 1, wherein said peripheral region have a width of about 200 to 1000 angstroms.

5. The method according to claim 1 further comprising step to provide a second masking layer formed subjacent said first masking layer.

6. The method according to claim 5, wherein said second masking layer is a silicon oxide layer serving as a pad oxide layer.

7. The method according to claim 5, wherein said second masking layer is formed with a pattern exposing said trench region.

8. The method according to claim 5, wherein said second masking layer has a thickness of about 50 to 500 angstroms.

9. A method for forming a dielectric liner on a trench region formed in a semiconductor substrate, said method comprising the sequential steps of:

providing stacked layers of a silicon oxide layer and a silicon nitride layer on said semiconductor substrate, wherein said silicon layer is located between said silicon nitride layer and said semiconductor substrate;

forming a first opening on said silicon nitride layer to expose said silicon oxide layer;

forming a silicon spacer on sidewalls of the opening;

forming a second opening on said silicon oxide layer to expose said semiconductor substrate;

forming a third opening on said exposed semiconductor substrate, wherein said trench region is consisted of said opening and said third opening;

removing said silicon spacer to expose a peripheral region of said silicon oxide layer;

forming an impurity-doped region in said semiconductor substrate only beneath a bottom of said trench region, wherein said impurity-doped region is located in a nonzero distance apart from said bottom of said trench region and within lateral lines which would extend from said bottom; and performing an oxidation using said silicon nitride layer as oxidation mask to form said dielectric liner on said sidewalls of said trench region, and said peripheral region of said silicon oxide layer.

10. The method according to claim 9, wherein said silicon spacer has a thickness of about 200 to 1000 angstroms.

11. The method according to claim 9, wherein said silicon nitride layer has a thickness of about 500 to 4000 angstroms.

12. The method according to claim 9, wherein said silicon nitride layer has a thickness of about 50 to 500 angstroms.

* * * * *